United States Patent [19]
Razeghi

[11] Patent Number: 5,658,825
[45] Date of Patent: Aug. 19, 1997

[54] METHOD OF MAKING AN INASSB/INASSBP DIODE LASERS

[75] Inventor: Manijeh Razeghi, Wilmette, Ill.

[73] Assignee: Northwestern University, Evanston, Ill.

[21] Appl. No.: 717,125

[22] Filed: Sep. 20, 1996

[51] Int. Cl.$^6$ ................................................. H01L 21/20
[52] U.S. Cl. ............................. 117/89; 438/37; 438/47
[58] Field of Search .......................... 437/129, 133, 437/128, 127; 372/45

[56] References Cited

U.S. PATENT DOCUMENTS

| | | | |
|---|---|---|---|
| 4,328,469 | 5/1982 | Scifres et al. | 372/45 |
| 5,079,774 | 1/1992 | Mendez et al. | 372/45 |
| 5,172,384 | 12/1992 | Goronkin et al. | |
| 5,213,654 | 5/1993 | Sasaki et al. | |
| 5,216,684 | 6/1993 | Wang et al. | |
| 5,251,225 | 10/1993 | Eglash et al. | |
| 5,300,793 | 4/1994 | Kondow et al. | |
| 5,307,200 | 4/1994 | Yoshida. | |
| 5,315,430 | 5/1994 | Brennan et al. | |
| 5,315,608 | 5/1994 | Choi et al. | |
| 5,389,396 | 2/1995 | Razeghi. | |
| 5,408,487 | 4/1995 | Uchida et al. | |
| 5,481,120 | 1/1996 | Mochizuki et al. | |
| 5,495,115 | 2/1996 | Kudo et al. | |
| 5,521,994 | 5/1996 | Takeuchi et al. | |
| 5,536,948 | 7/1996 | Lee. | |

OTHER PUBLICATIONS

Chiu et al., "Optically pumped laser oscillation at 3.9 μm from $Al_{0.5}Ga_{0.5}Sb/InAs_{0.91}SB_{0.09}/Al_{0.5}Ga_{0.5}Sb$ double heterostructures grown by molecular beam epitaxy on GaSb", Appl. Phys. Lett. 48:5, pp. 315–317, (Feb. 1986).

Chiu et al., "Room-temperature operation of InGaAsSb/AlGaSb double heterostructure lasers near 2.2 μm prepared by molecular beam epitaxy", Appl. Phys. Lett. 49:17, pp. 1051–1052, (Oct. 1986).

Khald et al., "Shallow diffusion of zinc into InAs and InAsSb", J. Appl. Phys., 64:9, pp. 4768–4770, (Nov. 1988).

"New III–V Double–Heterojunction Laser Emitting Near 3.2 μm", Electronics Letters, vol. 24:25, pp. 1542–1543, (Dec. 1988).

Eglash et al., "Efficient GaInAsSb/AlGaAsSb diode lasers emitting at 2.29 μm", Appl. Phys. Lett. 57:13, pp. 1292–1294, (Sep. 1990).

Andaspaeva et al., "Investigation of the temperature dependence of the threshold current density of double-heterostructure GaInAsSb lasers", Sov. Phys. Semicond. 25:3, pp. 240–244, (Mar. 1991).

Choi et al., "High-Efficiency High-Power GaInAsSb–AlGaAsSb Double-Heterostructure Lasers Emitting at 2.3 μm", IEEE Journal of Quantum Electronics, vol. 27:6, pp. 1555–1559, (Jun. 1991).

Choi et al., "Room-temperaature cw operation at 2.2 μm of GaInAsSb/AlGaAsSb diode lasers grown by molecular beam epitaxy", Appl. Phys. Lett. 59:10, pp.1165–1166, (Sep. 1991).

Menna et al., "3.06 μm InGaAsSb/InPSb diode lasers grown by organometallic vapor-phase epitaxy", Appl. Phys. Lett. 59:17, pp. 2127–2129, (Oct. 1991).

Choi et al., "High-power multiple-quantum-well GaInAsSb/AlGaAsSb diode lasers emitting at 2.1 μm with low threshold current density", Appl. Phys. Lett. 61:10, pp. 1154–1156, (Sep. 1992).

(List continued on next page.)

Primary Examiner—Charles L. Bowers, Jr.
Assistant Examiner—Ramamohan Rao Paladugu
Attorney, Agent, or Firm—Welsh & Katz, Ltd.

[57] ABSTRACT

InAsSb/InAsSbP/InAs Double Heterostructures (DH) and Separate Confinement Heterostructure Multiple Quantum Well (SCH-MQW) structures are taught wherein the ability to tune to a specific wavelength within 3 μm to 5 μm is possible by varying the ratio of As:Sb in the active layer.

8 Claims, 7 Drawing Sheets

SEPARATE CONFINEMENT HETEROSTRUCTURE MULTIPLE QUANTUM WELL (MQW).
InAsSb/InAsSbP/InAs DIODE LASER

OTHER PUBLICATIONS

Morosini et al., "Low-Threshold GaInAsSb/GaAlAsSb Double-Heterostructure Lasers Grown by LPE", IEEE Journal of Quantum Electronics, vol. 29:6, pp. 2103–2108, (Jun. 1993).

Choi et al., "GaInAsSb–AlGaAsSb Tapered Lasers Emitting at 2 μm", IEEE Photonics Technology Letters, vol. 5:10, pp. 1117–1119, (Oct. 1993).

Turner et al., "High-power diode-laser-pumped InAsSb/GaSb and GaInAsSb/GaSb lasers emitting from 3 to 4 μm", Appl. Phys. Lett. 64:2, pp. 152–154, (Jan. 1994).

Kurtz et al., "Midwave (4 μm) infrared lasers and light-emitting diodes with biaxially compressed InAsSb active regions", Appl. Phys. Lett. 64:7, pp. 812–814, (Feb. 1994).

Choi et al, "Double-heterostructure diode lasers emitting at 3 μm with a metastable GaInAsSb active layer and AlGaAsSb cladding layers", Appl. Phys. Lett. 64:19, pp. 2474–2476, (May 1994).

Baranov et al., "2.7–3.9 μm InAsSb(P)/InAsSbP low threshold diode lasers", Appl. Phys Lett. 64:19, pp. 2480–2482, (May 1994).

Zhang, "Continuous wave operation of InAs/InAs$_x$Sb$_{1-x}$ midinfrared lasers", Appl. Phys Lett. 66:2, pp. 118–120, (Jan. 1995).

Choi et al., "High-Power, High-Temperature Operation of GaInAsSb–AlGaAsSb Ridge-Waveguide Lasers Emitting at 1.9 μm", IEEE Photonics Tech. Lett., vol. 7:3, pp. 281–283, (Mar. 1995).

Turner et al., "Growth of InAsSb quantum wells for long-wavelength (~4μm) lasers"J. Vac. Sci. Technol. B 13:2, pp. 699–701, (Mar./Apr. 1995).

Garbuzov et al., "2.7μm InGaAsSb/AlGaAsSb laser diodes with continuous-wave operation up to –39°C", Appl. Phys. Lett. 67:10, pp. 1346–1348, (Sep. 1995).

Zegrya et al., "Characteristic features of the temperature dependence of the threshold current density of GaInAsSb double-heterostructure lasers with a thin active region", Semiconductors 29:12, pp. 1157–1161, (Dec. 1995).

Wang et al., "In-AlGasb and GaSb/AlGaSb double-heterostructure lasers grown by organometallic vapor phase epitaxy", Appl. Phys. Lett. 68:3, pp. 400–402, (Jan. 1996).

Kurtz et al., "CTuO—Mid-Infrared Diode Lasers", IEEE Lasers & Electro.–Optical Society vol. 7, pp. 169–173, (Jun. 1996).

Kim et al., "Photoluminesence study of InAsSb/InAsSbP heterostructures grown by low-pressure metalorganic chemical vapor deposition", Appl. Phys. Lett. 69:11, pp. 1–3, (Sep. 1996).

Mani et al., "Some characteristics of 3.2 μm injection lasers based on InAsSb/InAsSbP system", SPIE vol. 1362: pp. 38–48, (1990).

Aydaraliev et al., "Low-threshold long-wave lasers (λ = 3.0–3.6 μm) based on III–V alloys", Semicond. Sci. Technol. vol. 8, pp. 1575–1580 (1993).

Eglash et al., "InAsSb/AlAsSb double-heterostructure diode lasers emitting at 4 μm)", Appl. Phys. Lett. 64:(7), pp. 833–835 (Feb. 14, 1994).

Aydaraliev et al., "Radiation recombination in InAsSb/InAsSbP double heterostructures", Semiconductor Sci. B. Tech., vol. 10:2, pp. 151–156 (1995).

Kurtz et al., "Pseudomorphic InAsSb multiple quantum well injection laser emitting at 3.5 μm", Appl. Phys. Lett. 68:(10), pp. 1332–1334 (Mar. 4, 1996).

DOUBLE HETEROSTRUCTURE InAsSb/InAsSbP/InAs DIODE LASER

SEPARATE CONFINEMENT HETEROSTRUCTURE MULTIPLE QUANTUM WELL (MQW).

InAsSb/InAsSbP/InAs DIODE LASER

THRESHOLD CURRENT DENSITY VERSUS INVERSE CAVITY LENGTH OF DH InAsSb/InAsSbP/InAs DIODE LASERS

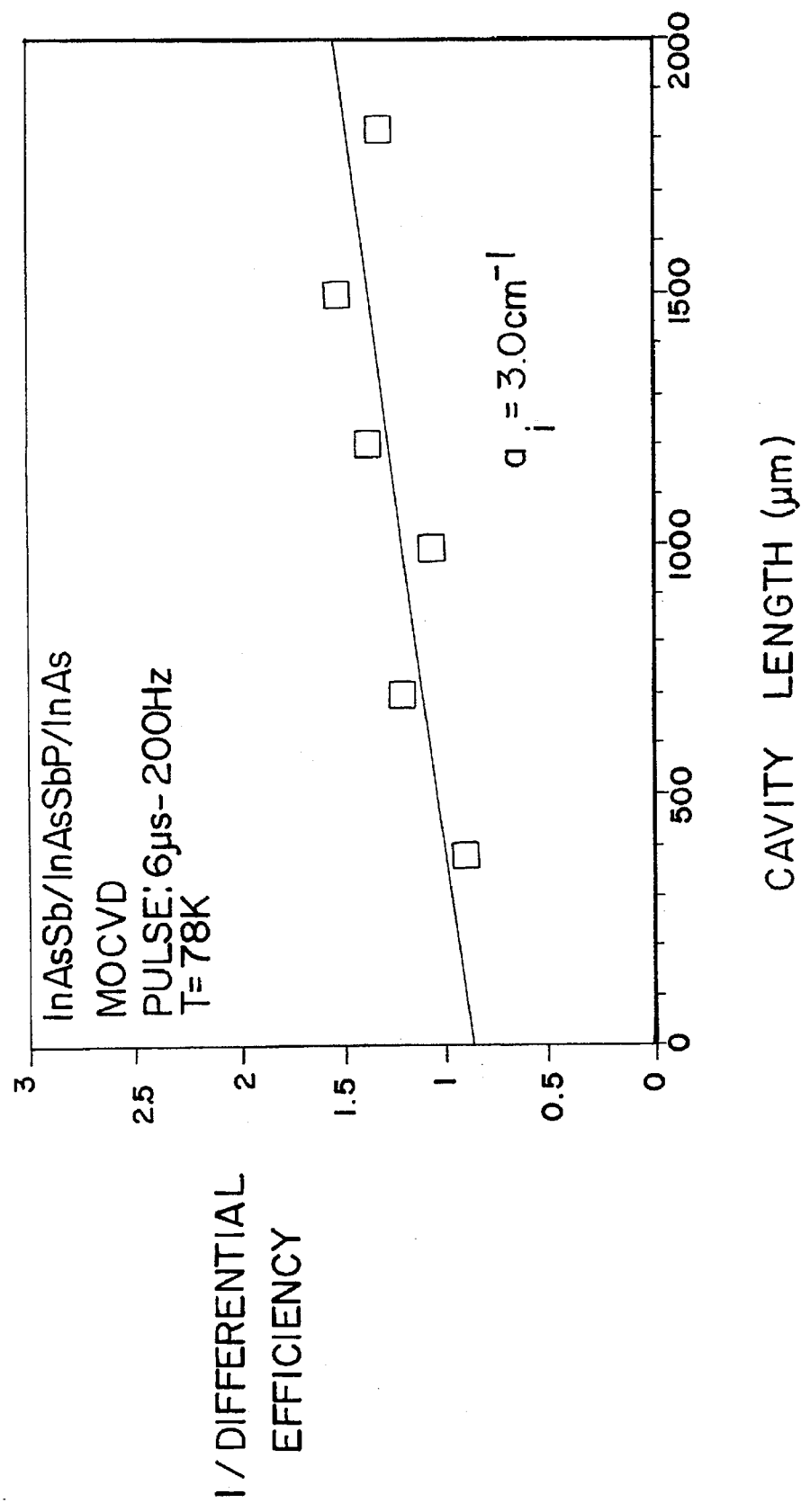
FIG. 7 INVERSE DIFFERENTIAL EFFICIENCY VERSUS CAVITY LENGTH OF DH InAsSb/InAsSbP/InAs DIODE LASERS

METHOD OF MAKING AN INASSB/INASSBP DIODE LASERS

This research was supported by the Division of Chemical Sciences, Office of the Basic Energy Sciences, U.S. Department of Energy (Grant DAAH04-95-1-0343).

This application relates to semiconductor III–V alloy compounds, and more particularly to a method of making III–V alloy compounds for use in mid-infrared lasers from 3–5 µm.

BACKGROUND OF THE INVENTION

The growth of semiconductor III–V compounds by chemical vapor deposition (CVD) using organometallics and hydrides as elemental sources has recently developed into a viable process with many potential commercial applications. The metallo-organic chemical vapor deposition (MOCVD) process, based on the pyrolysis of alkyls of group-III elements in an atmosphere of the hydrides of group-V elements, is a common growth technique because it is well adapted to the growth of submicron layers and heterostructures.

Open-tube flow systems are used at atmospheric or reduced pressures in producing the III–V alloys. The process requires only one high-temperature zone for the in situ formation and growth of the semiconductor compound directly on a heated substrate.

Low pressure (LP-) MOCVD growth method offers an improved thickness uniformity and compositional homogeneity, reduction of autodoping, reduction of parasitic decomposition in the gas phase, and allows the growth of high-quality material over a large surface area. The LP-MOCVD technique has been successfully used to grow InAsSb/InAsSbP alloy on an InAs substrate. InAsSbP alloys, which are potentially useful materials both for heterojunction microwave and optoelectronic device applications can be grown by liquid-phase epitaxy (LPE), molecular-beam epitaxy (MBE), conventional vapor-phase epitaxy (VPE), as well as MOCVD.

The disadvantages of LPE include growth problems with InAsSbP alloys and potential nonuniform growth as well as melt-back effect. Molecular-beam epitaxy is a very expensive and complex process, and difficulties have been reported with p-type doping and with the growth of phosphorus-bearing alloys. Vapor-phase epitaxy disadvantages include potential for hillock and haze formation and interfacial decomposition during the preheat stage.

The technique of LP-MOCVD is well adapted to the growth of the entire composition range of InAsSbP layers of uniform thickness and composition on InAs substrates. This results first from the ability of the process to produce abrupt composition changes and second from the result that the composition and growth rate are generally temperature independent. It is a versatile technique, numerous starting compounds can be used, and growth is controlled by fully independent parameters.

Growth by MOCVD takes place far from a thermodynamic equilibrium, and growth rates are determined generally by the arrival rate of material at the growing surface rather than by temperature-dependent reactions between the gas and solid phases.

One of the key reasons for the usefulness of this method is the possibility of obtaining high-purity and therefore high-mobility InAsSbP. As long-wavelength 2–6 µm InAsSbP electro-optical devices become more widely used, motivated by low fiber absorption and dispersion, high transmission through water and smoke, and greatly enhanced eye safety at wavelengths greater than 2 µm, LP-MOCVD offers the advantages of smooth uniform surfaces, sharp interfaces (lower than 5 Å for InAsSbP/InAs), uniformly lower background doping density, and economy of scale for large-area devices.

It is well known that the mid-infrared range from 3–5 µm is very attractive for several spectroscopic applications including atmospheric trace gas analysis and medical diagnostics, because in this spectral region many atmospheric species have strong rotational, vibrational and overtone absorption bands. Unfortunately, the performance of narrow band-gap semiconductor lasers is strongly influences by Auger processes and carrier leakage effects.

The high quality of double heterostructure laser diodes based on the $InAs_{0.95}Sb_{0.05}/InAs_{0.40}Sb_{0.22}P_{0.38}$ alloy on InAs substrate (100) grown by MOCVD is known which shows low threshold current density and a high output power. However, for the InAsSb/InAsSbP system it would be desirable to tune the system to emit a specific wavelength within that range.

SUMMARY OF THE INVENTION

An object, therefore, of the invention is the growth of high quality InAsSb/InAsSbP ($\lambda$ between 3 and 5 µm) double heterostructures by low pressure metallorganic chemical vapor deposition (LP-MOCVD).

A further object of the subject invention is a separate confinement heterostructure laser structure grown with strained layer quantum wells.

A still further object of the subject invention is a method of controlling the wavelength range and energy gap of the diode laser by varying the composition of the strained layer quantum wells.

These and other objects are attained by the subject invention wherein SCH-SQW (separate confinement heterostructure, single quantum well) and DH (double heterostructure) diode lasers of the formula InAsSb/InAsSbP on InAs substrates which operate at powers up to 900 mW with emitting apertures of 100 µm are found to be superior to other lasers in terms of quantum efficiency and temperature rise at the mirror facets. By varying compositions and by employing strained layer quantum wells, InAsSb/InAsSbP diode lasers can be fabricated over the wavelength range of 3–5 µm.

DESCRIPTION OF THE DRAWINGS

FIG. 7 is a plot of a pulsed inverse differential efficiency versus cavity length of DH InAsSbP/InAsSb/InAs diode lasers at 78 K. made in accordance with the subject invention.

DETAILED DESCRIPTION OF THE INVENTION

Figure 1:
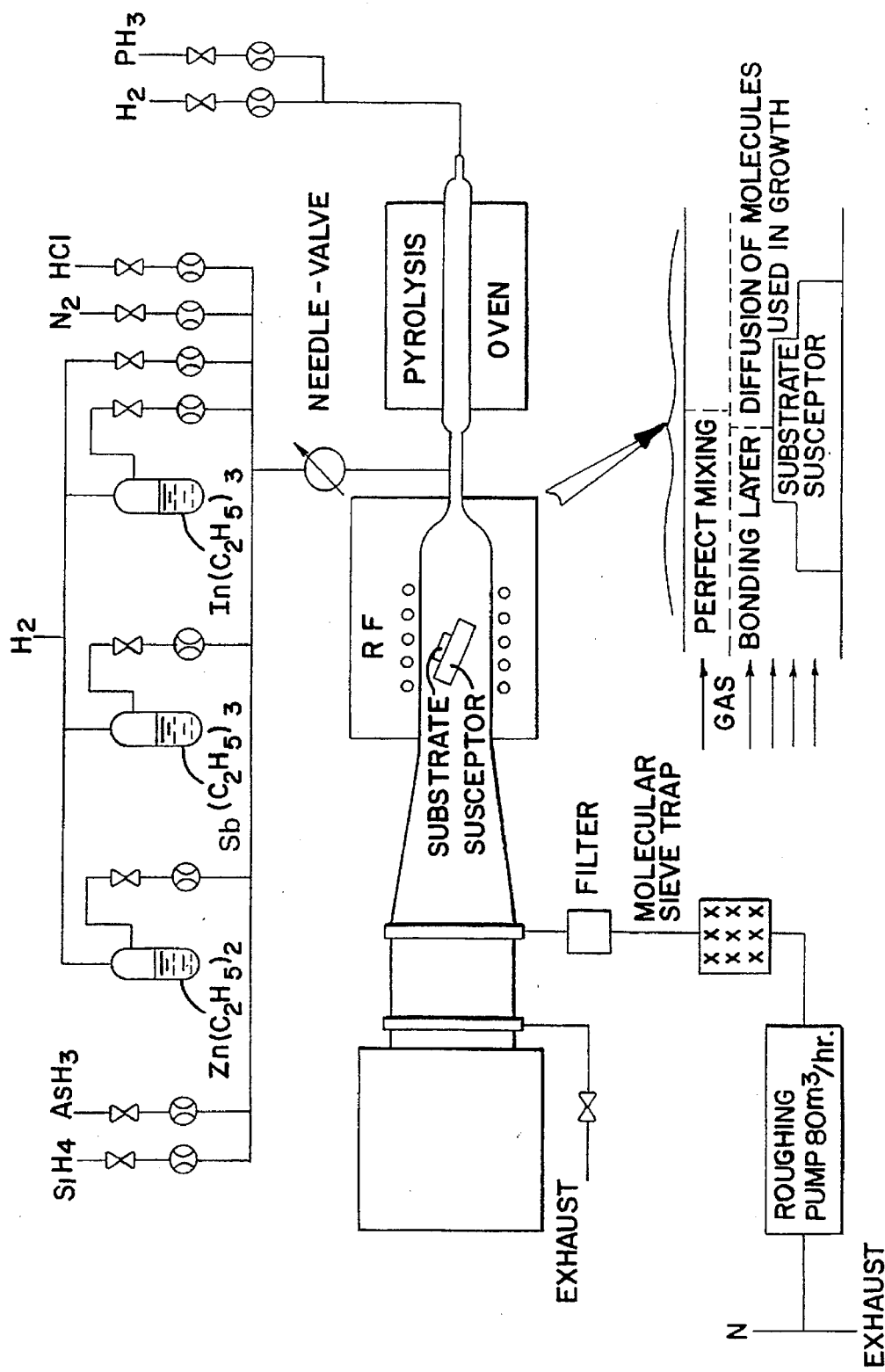
FIG. 1 is a schematic diagram of the LP-MOCVD reactor for use in the method of the subject invention.

The reactor and associated gas-distribution scheme used herein are shown in FIG. 1. The system consists of a cooled quartz reaction tube (diameter 5 cm in the substrate area) pumped by a high-capacity roughing pump (120 hr$^{-1}$) to a vacuum between 10 and 300 Torr. The substrate was mounted on a pyrolytically coated graphite susceptor that was heated by rf induction at 1 MHz. The pressure inside the reactor was measured by a mechanical gauge and the temperature by an infrared pyrometer. A molecular sieve was used to impede oil back-diffusion at the input of the pump. The working pressure was adjusted by varying the flow rate of the pump by using a control gate valve. The gas panel was classical, using ¼-inch stainless steel tubes and Swagelock fittings. Flow rates were controlled by mass flowmeters.

The reactor was purged with a hydrogen flow of 4 liters min$^{-1}$, and the working pressure of 78 Torr was established by opening the gate valve that separated the pump and the reactor. The evacuation line that was used at atmospheric pressure was automatically closed by the opening of the gate valve. The gas flow rates were measured under standard conditions, i.e., 1 atm and 20° C., even when the reactor was at subatmospheric pressure. The pressure in the gas panel was regulated by the needle valve placed between the gas panel and the reactor. The needle valve was adjusted to maintain a constant pressure of 1 atm on the gas panel, thereby ensuring reproducibility of flow-rate measurements.

The gas sources used in this study for the growth of InAsSbP by LP-MOCVD are listed below.

| Group-III Sources | Group-V Sources |
|---|---|
| In(CH$_3$)$_3$ | AsH$_3$ |
| In(C$_2$H$_5$)$_3$ | As(C$_2$H$_5$)$_3$ |
| (CH$_3$)$_2$In(C$_2$H$_5$) | As(CH$_3$)$_3$ |
| | HAS(C$_2$H$_5$)$_3$ |
| | PH$_3$ |
| | P(t-Bu)$_3$ |
| | As(t-Bu)$_3$ |
| | Sb(CH$_3$)$_3$ |
| | Sb(C$_2$H$_5$)$_3$ |

The organometallic group-III species trimethyl Antimony (TmSb) are contained in stainless steel bubblers, which are held in controlled temperature baths at ≈ 0° C., respectively. An accurately metered flow of purified H$_2$ for TMI and TmSb is passed through the appropriate bubbler. To ensure that the source material remains in vapor form, the saturated vapor that emerges from the bottle is immediately diluted by a flow of hydrogen. The mole fraction, and thus the partial pressure, of the source species is lower in the mixture and is prevented from condensing in the stainless steel pipe work.

Pure and diluted arsine (AsH$_3$) and pure phosphine (PH$_3$) are used as sources of As and P, respectively. The metal alkyl or hydride flow can be either injected into the reactor or into the waste line by using two-way valves. In each case, the source flow is first switched into the waste line to establish the flow rate and then switched into the reactor. The total gas flow rate is 8 liters min$^{-1}$ during growth. Stable flows are achieved by the use of mass flow controllers.

Dopants usable in the method of the subject invention are as follows:

| n dopant | p dopant |
|---|---|
| H$_2$Se | (CH$_3$)$_2$Zn |
| H$_2$S | (C$_2$H$_5$)$_2$Zn |
| (CH$_3$)$_3$SnS$_1$H$_4$ | (C$_2$H$_5$)$_2$Be(C$_2$H$_5$)$_2$Mg |
| (C$_2$H$_5$)$_3$SnS$_2$H$_6$ | (CH$_3$)$_2$Cd |

Semi-insulating or n$^+$ substrates are supplied by MCP, Crystacomm, Metals Research, or Sumitomo in the form of ingots or polished wafers. Wafers are sliced 2° off (100) toward (110) and chemically etched for 10 seconds at room temperature in a 15% bromine-methanol solution in order to remove 20 μm from each side. The wafers were then mechanochemically polished in a solution of 1.5% bromine in methanol, removing a further 80–100 μm. The substrates were finally cleaned in methanol and rinsed in isopropyl alcohol. The substrates were etched again, just before use, by dipping in 1% bromine in methanol at room temperature for one minute, rinsing in warm isopropyl alcohol, and drying. An n$^+$ tin-doped substrate was used for each experiment.

The epitaxial layer quality is sensitive to the pretreatment of the substrate and the alloy composition. Pretreatment of the substrates prior to epitaxial growth was thus found to be beneficial. One such pretreatment procedure is as follows:

1. Dipping in H$_2$SO$_4$ for 3 minutes with ultrasonic agitation;
2. Rinsing in Deionized H$_2$O;
3. Rinsing in hot methanol;
4. Dipping in 3% Br in methanol at room temperature for 3 minutes (ultrasonic bath);
5. Rinsing in hot methanol;
6. Dipping in H$_2$SO$_4$ for 3 minutes;
7. Rinsing in deionized H$_2$O, and
8. Rinsing in hot methanol.

After this treatment, it is possible to preserve the substrate for one or two weeks without repeating this treatment prior to growth.

Figure 2:
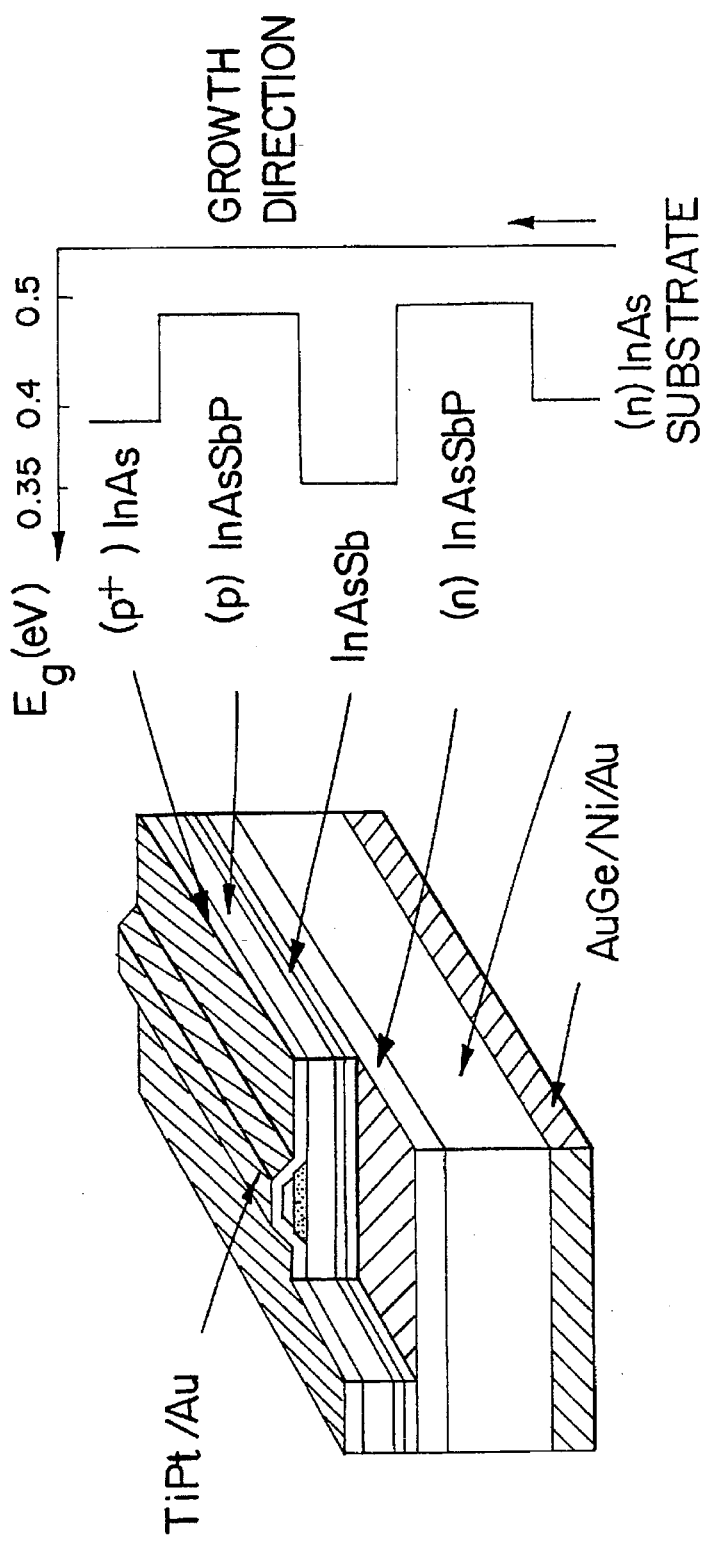
FIG. 2 is a cross-section and band structure of a double heterostructure InAsSbP/InAsSb/InAs laser structure for emission of radiation from 3 to 5 µm.
Figure 3:
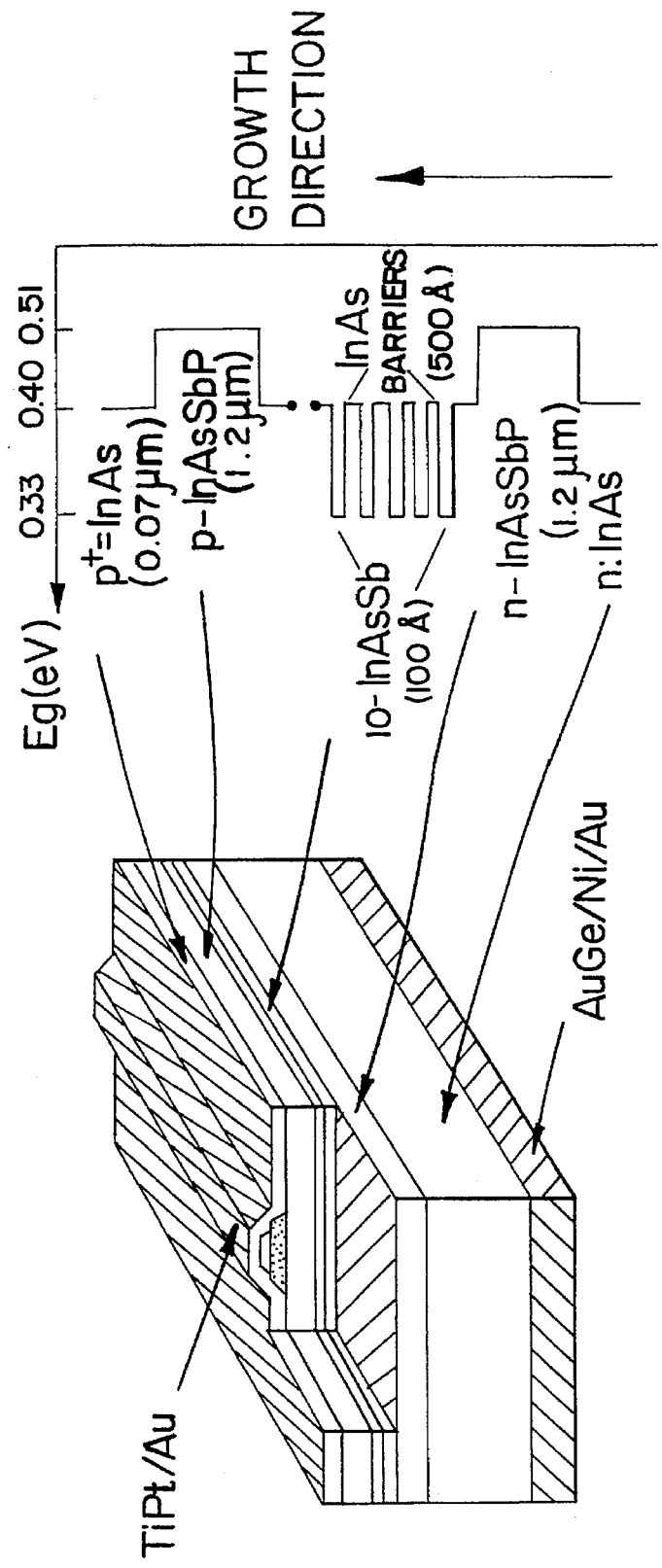
FIG. 3 is a cross-section and band structure of a separate confinement heterostructure multiple quantum well of a InAsSbP/InAsSb/InAs laser structure for emission radiation from 3 to 5 µm.

The invention is described in accordance with the drawings and, in particular, with respect to FIGS. 2 and 3. FIG. 2 is a schematic cross-section of a double heterostructure InAsSbP/InAsSb/InAs laser structure formed in accordance with the subject invention. FIG. 3 is a schematic cross-section of a separate confinement heterostructure InAsSbP/InAsSb/InAs laser structure formed in accordance with the subject invention.

The epitaxial layers for the Double Heterostructure (DH) and the Separate Confinement Heterostructure (SCH) of InAsSb/InAsSbP/InAs are grown by low-pressure metallorganic chemical vapor deposition (LP-MOCVD). The DH InAsSbP/InAsSb/InAs laser structure consists of the following: a (100) oriented Te-doped (~$10^{18}$ cm$^{-3}$) n-InAs substrate, a 1.2 μm-thick Sn-doped ($N_a$~7×$10^{17}$ cm$^{-3}$) n-InAs$_{0.145}$Sb$_{0.3}$P$_{0.555}$ cladding layer, a 1.0 μm-thick undoped InAs$_{0.95}$Sb$_{0.05}$ active layer, a 1.2 μm-thick Zn-doped ($N_a$~5×$10^{17}$ cm$^{-3}$) p-InAs$_{0.145}$Sb$_{0.3}$P$_{0.555}$ cladding layer and a 0.07 μm–0.09 μm-thick Zn-doped (~$10^{20}$ cm$^3$) p-InAs cap layer. FIG. 2 shows the cross-section and band structure of the DH laser structure of the diode laser invention. The separate confinement heterostructure multiple quantum well (SCH-MQW) laser structure are grown in the following order: n-InAs doped buffer ($10^{18}$ cm$^{-3}$), a 1.2 μm thick Sn-doped ($N_a$~7×$10^{17}$ cm$^{-3}$) n-InAs$_{0.145}$Sb$_{0.3}$P$_{0.555}$ cladding layer, a 0.2 μm undoped layer of InAs or InAsSbP with higher As composition than that in InAsSbP cladding layer in order to give optical confinement, an undoped InAs$_{0.88}$Sb$_{0.12}$InAs(Sb)(P) multi-quantum well active region, a 0.2 μm undoped waveguide layer of InAs or InAsSbP, 1.2 μm-thick Zn-doped ($N_a$~5×$10^{17}$ cm$^{-3}$) p-InAs$_{0.145}$Sb$_{0.3}$P$_{0.555}$ cladding layer and a 0.07 μm–0.09 μm thick Zn-doped (~$10^{20}$ cm$^{-3}$)p InAs cap layer. FIG. 3 shows the band structure of the SCH-MQW InAsSbP/InAsSb/InAs laser structure in accordance with the subject invention. The DH and SCH-MQW layers can be grown on (100) InAs substrates that are doped by a combination of Te, Si, Ge or S dopants. In general, the design and fabrication of DH and SCH-MQW laser structures offers a number of interesting characteristics. The most important characteristic includes: low threshold current density, a small variation of the threshold current with temperature, high differential quantum efficiency, low series resistance, high characteristic temperature $T_0$ and the ability to tune to a particular wavelength.

As stated, samples are grown in the horizontal, cold-wall, quartz tube low pressure metallorganic chemical vapor deposition (LP-MOCVD) reactor of FIG. 1 at a pressure of 78 torr. The precursor source used herein are trimethyl indium (TMIn), trimethyl antimony (TMSb) and both pure and diluted arsine (AsH$_3$) and phosphine (PH$_3$). Diethylzinc (DEZn) and Tetraethyltin (TeSn) are used for p-type and n-type doping, respectively. Other combinations of p-dopants such as Mg, Cd and Be are used for the upper p-InAsSbP cladding layer in which the LP-MOCVD system is very versatile in providing such combinations of dopants. Furthermore, the LP-MOCVD system has the ability to dope the p-InAs cap layer with a high dopant concentration in the range of $10^{20}$ cm$^{-3}$ so as to provide low series resistance. The growth temperature was varied from 460° C. to 510° C. in order to obtain a high-quality InAsSb active layer. The growth rate has approximately a linear relationship with the mass flow of TMIn, which indicates a diffusion-limited process in this temperature range.

The V/III ratio is also very critical in growing InAsSb(P) alloys. For the active layer, the V/III molar gas flow ratio is varied between 40 to 100, keeping the same composition x of InAs$_x$Sb$_{1-x}$ and $V_{AsH3}$:$V_{TMSb}$≈2.4:1 for a Sb composition of 5~6%. For the upper and lower cladding layers, the V/III molar gas flow ratio is also about 70 and the growth condition was varied with the ratio of flow rate of As/Sb, As/P and Sb/P. The growth condition was optimized to improve the crystalline quality, increase the energy gap and to make sharp interfaces between InAsSb/InAsSbP. Due to the different thermal stabilities for precursors PH$_3$ and TMSb and different sticking coefficients of elemental phosphorous and antimony on the semiconductor surface, it is important to find the proper flow rate and the growth temperature. The stable hydride PH$_3$ requires a much larger residence time for efficient cracking in the hot zone above the susceptor than the less stable TMSb, which causes difficulties in controlling the relative rates of incorporation of P and Sb into the solid. It is well known that when during the growth of Sb-containing materials, the excess Sb will generate droplets on the sample surface and give a very rough surface morphology. In the growth of InAsSb and InAsSbP, the group V composition is dominated by As and P. The much stronger As and P driving force for incorporation prevents the excess Sb from bonding with the sample surface, thus no Sb droplets are generated. A high flow rate of TMSb is helpful to obtain a smooth surface and high crystal quality. The growth rate, another important parameter, was varied between 0.8 μm/hr and 1.5 μm/hr. The lowering of the growth rate will improve the crystal quality; a growth rate is employed around 1 μm/hr to compromise both the total growth time for the relatively thick layers and the crystalline quality.

Prior to loading into the reactor chamber, the n-type (100) InAs substrates were degreased with organic solvents and etched with a H$_2$SO$_4$:H$_2$O$_2$:H$_2$O (1:1:1) solution. The invention laser structure comprises an InAs$_{0.95}$Sb$_{0.05}$ buffer layer and a 1.0 μm undoped InAs$_{0.95}$Sb$_{0.05}$ active layer. The active layer is sandwiched between two InAs$_{0.145}$Sb$_{0.3}$P$_{0.555}$ upper and lower cladding layers. A final cap layer of p-doped ($10^{20}$ cm$^{-3}$) InAs layer is grown.

TABLE 1

Optimum growth conditions of InAsSbP/InAsSb/InAs structure.

| | InAs | InAsSbP | InAsSb |
|---|---|---|---|
| Growth Pressure (Torr) | 76 | 76 | 76 |
| Growth Temperature (°C.) | 520 | 520 | 520 |
| Total H$_2$ Flow (liter/min) | 7 | 7 | 7 |
| AsH$_3$ (cc/min) | 50 | 20 (5% diluted AsH$_3$) | 8 |
| TMI (cc/min) | 100 | 120 | 120 |
| TmSb (cc/min) | — | 80 | 50 |
| PH$_3$ (cc/min | — | 12 | — |
| Growth Rate (Å/min) | 150 | 180 | 175 |

For InAsSb (λ=3.2 μm), one obtains the ratio of partial pressure of $P_{As+Sb}/P_{In}$=47, $P_{As}/P_{Sb}$=4, $P_{(As+P)}/P_{(In+Sb)}$≈600.

After optimization of growth conditions for InAs and InAsSb layers, LP-MOCVD has been successfully used for the growth of InAsSb and InAsAlSb double heterostructure layers, for laser application emitting between 3 and 5 μm. The various compositions were produced by controlling the flow of the relevant component, as in the case of InAsSbP mentioned previously.

The inventive grown wafers of DH and SCH InAsSbP/InAsSb/InAs are fabricated by the following procedure and conditions:

Broad-area lasers with 100 μm-wide contact stripes are fabricated on a p-doped (~×$10^{20}$ cm$^{-3}$) InAs layer by depositing metal layers of Ti (300 Å–450 Å)/Pt (400 Å–550 Å)/Au (1800 Å–2300 Å) by utilizing lift-off techniques. The InAs cap layer between the patterned stripes is chemical etched using H$_2$SO$_4$:H$_2$O$_2$:H$_2$O (1:1:40) ratio in order to localize the injection current in the lateral direction. The n-InAs substrate is mechanically lapped and polished to a thickness of 100 μm–120 μm. A final n-type ohmic contact is formed on the n-InAs substrate by depositing AuGe (700 Å–800 Å)/Ni (300 Å–400 Å)/Au (1800 Å–2300 Å). Thermal treatment of the p- and n-ohmic contacts are performed at temperatures between 300° C.–320° C. for 3–4 minutes under controllable forming gas ambient (10% $H_2$—$N_2$) to obtain low-contact resistance of 0.2Ω at 78 K. and 0.60Ω at 300 K. The wafers are cleaved into single diode chips ranging from 300 μm to 1500 μm in cavity length. The single diodes are bonded onto a coated indium copper heatsink prior to testing. The SCH and DH InAsSbP/InAsSb/InAs diode lasers are measured in both pulse (pulse width: 6 μs–200 Hz) and cw operations. For chips cleaved from the same bar, the standard deviation in the lasing threshold current density is only ±5%. For a large slice area (10 $cm^2$), the standard deviation in lasing threshold was typically less than 20%.

Figure 4B:
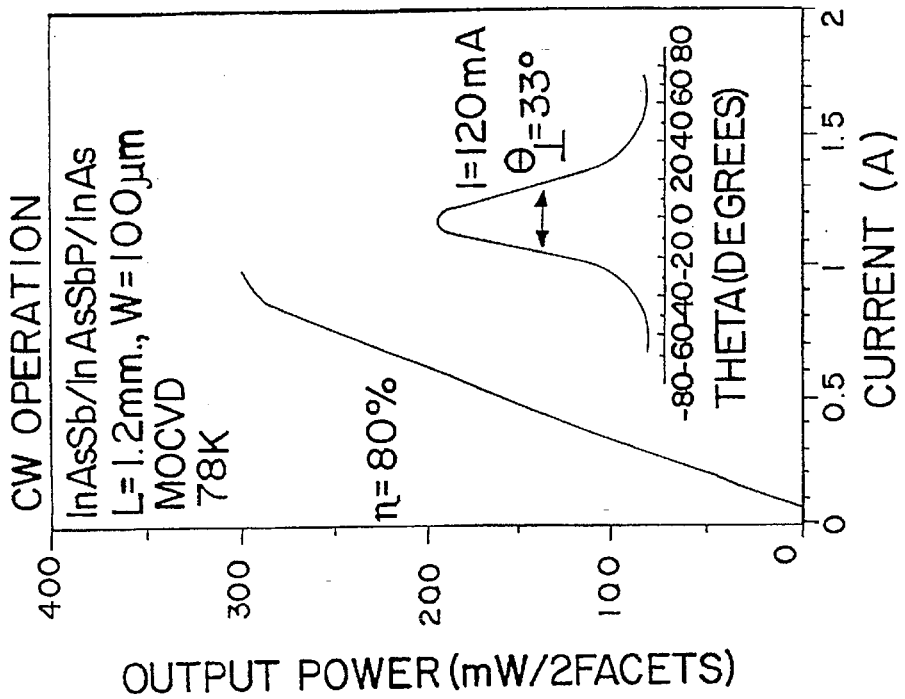
FIG. 4b is a plot of the output power versus injection current of DH InAsSbP/InAsSb/InAs diode laser with 100 µm wide aperture for cw operation at 78 K. made in accordance with the invention. The inset of 4(b) is a far-field of the subject invention with FWHM of 33° in the perpendicular direction.
Figure 4A:
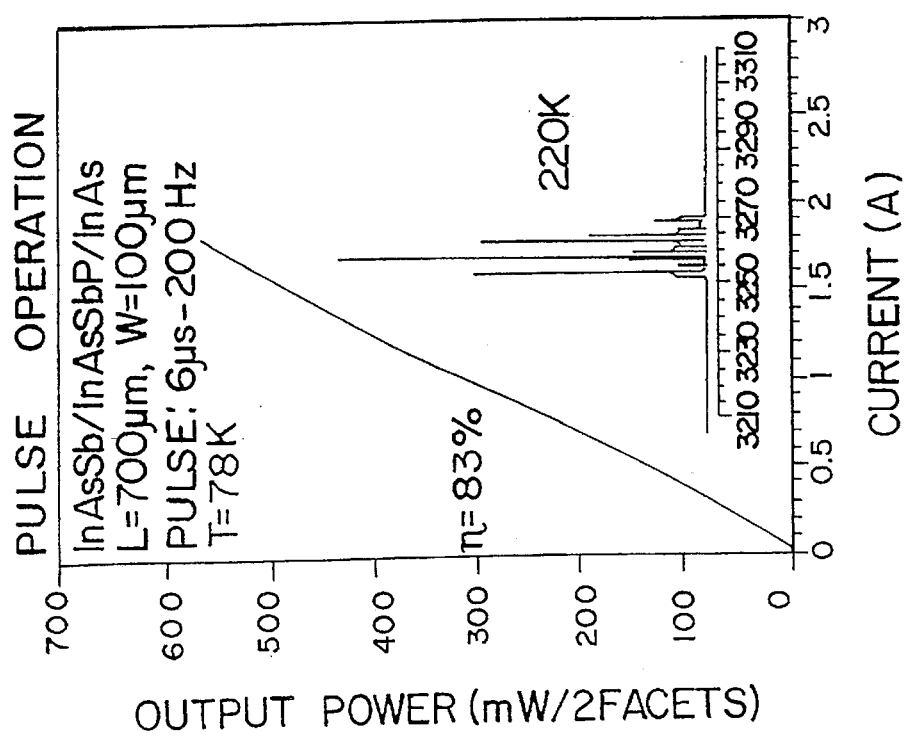
FIG. 4a is a plot of the output power versus injection current of DH InAsSbP/InAsSb/InAs diode laser with 100 µm wide aperture for pulse operation at 78 K. The inset of plot 4(a) is the emission spectrum of the invention device operating at high temperature of 220 K.

All the layers in the fabricated double heterostructure and separate confinement heterostructure are grown by LP-MOCVD and processed into diode lasers ranging from 300 μm to 1500 μm in cavity length, as described above. The light-current characteristics of these DH and SCH-MQW lasers are illustrated in FIGS. 4a & 4b and 5a & 5b. FIG. 4a shows pulsed operation resulting in an output power as high as 660 mW per two facets, emitting at 3.19 μm, for a 100 μm-wide laser with cavity length of 700 μm at 78 K. The differential quantum efficiency corresponding to this cavity length was determined to be 83%, showing no sign of any nonlinearities or kinks. The inset of FIG. 4a shows the lasing spectrum of the same diode operating at high temperatures of 220 K. The characteristic temperature $T_o$ for these lasers were in the range of 40 K.–45 K. for temperatures up to 130 K. Continuous wave operation at 78 K. resulted in output power of 300 mW per two facets with differential efficiency of 80% at a cavity length of 1.2 mm as shown in FIG. 4b. The inset of FIG. 4b demonstrates that the far field pattern perpendicular to the junction plane can be as narrow as 33°, compared to ~60° in InAsSb/InAlAsSb lasers. Measurements of the far field distribution in the perpendicular direction to the structure are in full agreement with the calculated values using the refractive index values for InAsSb and InAsSbP interpolated from values of constituent binaries.

Figures 5A, 5B:
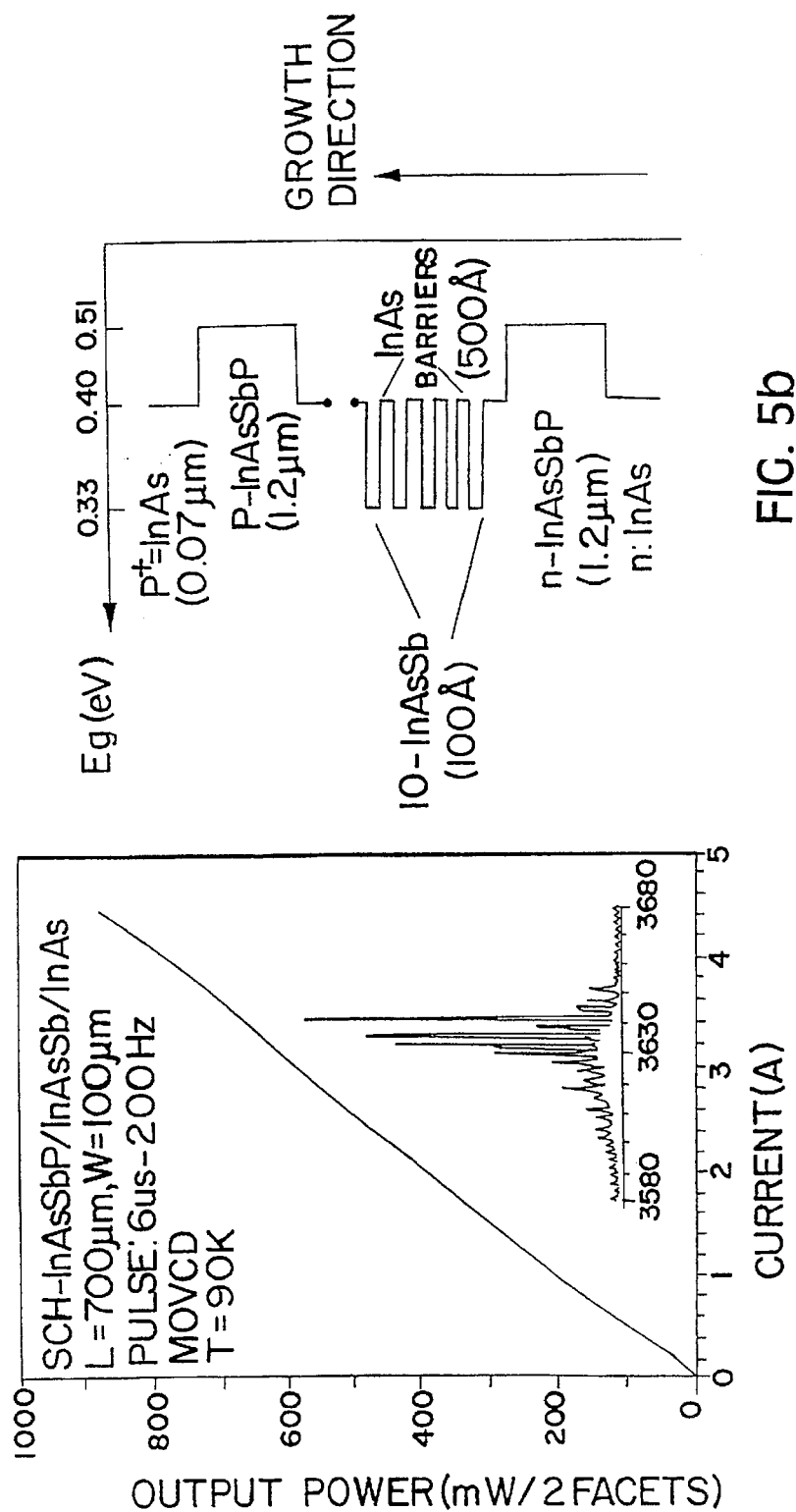
FIG. 5a is a plot of the output power versus injection current of SCH multiple quantum well (MQW) InAsSbP/InAsSb/InAs diode laser with a 100 μm-wide aperture for a pulse operation at 78.
FIG. 5b is the band structure of the SCH-MQW made in accordance with the subject invention.
Figure 6:
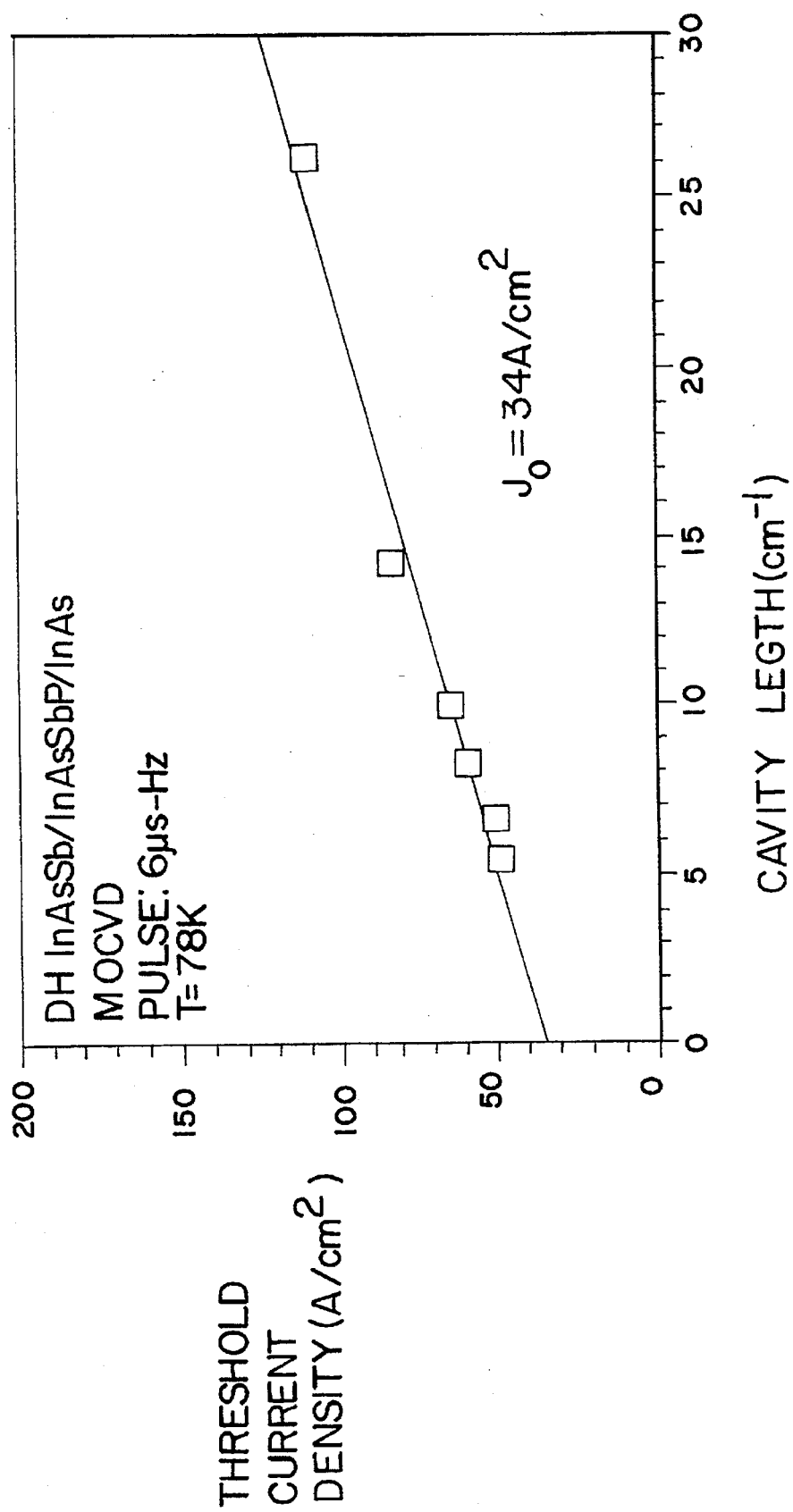
FIG. 6 is a plot of the threshold current density versus inverse cavity length of DH InAsSbP/InAsSb/InAs diode lasers at 78 K. made in accordance with the subject invention.

The SCH InAsSbP/InAsSb/InAs lasers formed, as described in the above invention, consists of output powers of 900 mW per two facets at cavity length of 700 μm and 100 μm-wide aperture at 90 K. as shown in FIGS. 5a and 5b. The characteristic temperature $T_o$ of these SCH-MQW InAsSbP/InAsSb/InAs lasers is 108 K. which has been achieved from these SCH diode lasers. Measurements of $J_{th}$ and $\eta_d$ for various cavity lengths of diode lasers were performed at 78 K. for the DH-InAsSbP/InAsSb/InAs lasers. Differential quantum efficiency as high as 90% and threshold current density in the range of 40 A/$cm^2$ were obtained for cavity lengths 700 μm and 1800 μm, respectively, with 100 μm stripe width. The internal loss of these InAsSbP/InAsSb/ InAs laser devices is determined by measuring the differential quantum efficiency laser at several cavity lengths. FIG. 7 shows the reciprocal of the measured total quantum efficiency as function of cavity length. Using a linear approximation, the internal loss α is determined to be $3.0^{cm-1}$. The dependence of $J_{th}$ as function of mirror loss ($\alpha_m \approx 1/L$) as shown in FIG. 6 shows a transparency current density of 34 A/$cm^2$.

EXAMPLE 1

A double heterostructure for a diode laser as set forth in FIG. 2 was prepared on a Sn-doped InAs substrate according to the above methods and in the following manner. First, a 1.21-μm thick InAsSbP cladding layer 2.4 μm wavelength composition doped with Sn; undoped 1.0 μm active layer of $InAs_{0.95}Sb_{0.05}$ and a 1.20 μm thick Zn-doped InAsSbP cladding layer were successively grown by LP-MOCVD on a Si-doped (100) 2° off InAs substrate. The growth temperature was 500° C. The resulting laser diode formed from this DH structure exhibited a wavelength of λ=3.2 μm.

Other DH structures prepared as in Example 1 are set forth in Table 2, which includes those results of Example 1. Examples 1, 2 and 4 are InAsSbP/inAsSb/InAsSbP DH and Example 3 is InAsSbP/InAs/InAsSbP DH, all on InAs (100) substrates.

TABLE 2

| Example | Lower cladding layer thickness (μm) | Active layer thickness (μm) | Upper cladding layer thickness (μm) | Mismatch between DH structure and InAs substrate | Growth temperature (°C.) | Cladding layer barrier height, $\Delta E_g$ at 80K (meV) |
| --- | --- | --- | --- | --- | --- | --- |
| 1 | 1.21 | 0.91 | 1.20 | 0.35% | 465 | 96.6 |
| 2 | 1.29 | 1.09 | 1.389 | 0.371% | 520 | 98.6 |
| 3 | 1.15 | 0.95 | 1.211 | 0.046% | 520 | 98.7 |
| 4 | 1.2 | 1.13 | 1.354 | 0.34% | 520 | 125.2 |

Various other heterostructures were prepared using the procedure set forth above, resulting in a structure such as that set forth in FIG. 3. In these structures, the composition of the active InAsSb layer was controlled by varying the partial pressures of the source ingredients. The cladding layer and other layers were maintained at the compositions set forth in Example 1. Thus, different compositions of the active layer were prepared as set forth in Table 3 below.

TABLE 3

| Example | Material (Active Layer) | Growth Temp. (°C.) | $AsH_3$ cc/min | TMIn cc/min of | TmSb cc/min of | λ (nm) |
| --- | --- | --- | --- | --- | --- | --- |
| 4 | InAs | 520 | 50 | 100 | — | 3.0 |
| 5 | $InAs_{0.95}Sb_{0.05}$ | 520 | 8 | 120 | 50 | 3.2 |
| 6 | $InAs_{0.8}Sb_{0.2}$ | 520 | 20 (5% diluted $AsH_3$) | 120 | 50 | 5.0 |

In Example 7, InSb is grown at 520° C. with 120 cc/min of TmIn, 40 cc/min of TmSb for a λ of about 5.0.

In a similar fashion, diode lasers were prepared having the same substrate, cladding, waveguide, and cap layers. In each, the active layer composition was varied, resulting in different lasing wavelengths. The results are set forth in Table 4 below.

TABLE 4

| Example | Active Layer | $E_g$ (eV) | $\lambda$ (nm) |
|---------|--------------|------------|----------------|
| 8 | InAs | 0.41 | 3.0 |
| 9 | $InAs_{0.95}Sb_{0.05}$ | 0.38 | 3.2 |
| 10 | $InAs_{0.8}Sb_{0.2}$ | 0.28 | 5.0 |

The resulting diode lasers have exhibited different wavelengths in the absorption band as set forth in Table 3 and 4. From the above Tables, it is clear that the variation of the As/Sb ratios of the respective layers of the heterostructure results in a concomitant variation in the wavelength of light emitted by the diode laser, most notably from about 3 μm to about 5 μm.

Thus, as the ratio of As:Sb varies from about 1:0 to about 4:1, the wavelength increases to from about 3 μm to about 5 μm.

More specifically, the wavelength of the diode laser of the subject invention varies proportionately with the concentration of As (and inversely proportional with the Sb concentration) in the compositional structure. Thus, by the method of the subject invention, the wavelength of a diode laser can be adjusted as desired within the range of 3.0 μm to 5 μm.

While the invention has been described with reference to a preferred embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments and equivalents falling within the scope of the appended claims.

Various features of the invention are set forth in the following claims.

I claim:

1. A method for the preparation of a strained layer heterostructure for a diode laser by LP-MOCVD comprising the steps of:

a) preparing a substrate of n-InAs as claimed;

b) growing, in succession, the following layers on said substrate:

1) a first cladding layer doped with a n-type dopant;

2) an undoped active layer of $InAs_{1-x}Sb_x$ between said cladding layers;

3) a second cladding layer doped with a p-type dopant, and c) varying the composition of said active layer by varying the value of x between 0 and 1 so that the wavelength of light emitted by said diode laser is controlled from about 3 μm to about 5 μm.

2. The method of claim 1 including the step of doping said first cladding layer with Si.

3. The method of claim 1 including the step of doping said second cladding layer with Zn.

4. The method of claim 1 wherein said active layer is varied in composition from about InAs to InAsSb.

5. A method for tuning the wavelength of a diode laser with the preparation of a strained layer heterostructure by LP-MOCVD comprising the steps of:

a) preparing a heated substrate;

b) growing, in succession, the following layers on said substrate by the flow of trimethyl indium, trimethyl antimony, arsine and phosphine to said heated substrate:

1) a first cladding layer of InAsSbP;

2) a first waveguide layer of InAsSbP;

3) an undoped active layer of a InAsSb/InAsSbP multi-quantum well active region composition;

4) a second waveguide layer of InAsSbP;

5) a second cladding layer of InAsSbP; and 6) a final cap layer of InAs highly doped (~$10^{20}$ cm$^{-3}$)

c) doping said cladding layers, terminating the flow of said trimethyl indium, triethyl gallium, arsine and phosphine; and controlling the wavelength of said laser by varying the proportional composition of As and Sb in the active layer.

6. The method of claim 5 whereby the step of controlling the wavelength of said laser includes varying flow rates of trimethyl antimony and arsine inversely to one another.

7. The method of claim 5 including the step of doping said first cladding layer with Si.

8. The method of claim 5 including the step of doping said second cladding layer with Zn.

* * * * *